(12) United States Patent
Hnayno et al.

(10) Patent No.: US 11,768,035 B2
(45) Date of Patent: Sep. 26, 2023

(54) COOLING ARRANGEMENT HAVING A CLOSED LOOP, A SEMI-OPEN LOOP AND AT LEAST ONE FAN

(71) Applicant: OVH, Roubaix (FR)

(72) Inventors: Mohamad Hnayno, Roubaix (FR); Hadrien Bauduin, Villeneuve d'Ascq (FR); Anas Chakir, Rollegem (BE); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/827,897

(22) Filed: May 30, 2022

(65) Prior Publication Data

US 2022/0390178 A1 Dec. 8, 2022

(30) Foreign Application Priority Data

May 31, 2021 (EP) .................................. 21305725

(51) Int. Cl.
*F28C 1/14* (2006.01)
*F28D 5/02* (2006.01)

(52) U.S. Cl.
CPC .................. *F28C 1/14* (2013.01); *F28D 5/02* (2013.01); *F28C 2001/145* (2013.01)

(58) Field of Classification Search
CPC ......... F28C 1/14; F28C 2001/145; F28D 5/02
USPC ......................................... 261/147, 149, 151
See application file for complete search history.

(56) References Cited

U.S. PATENT DOCUMENTS

| | | | |
|---|---|---|---|
| 4,107,942 A | 8/1978 | Fairman | |
| 4,827,733 A * | 5/1989 | Dinh | ........................ F24F 6/02 62/196.3 |
| 7,887,030 B2 | 2/2011 | Hentschel et al. | |
| 8,635,878 B2 | 1/2014 | Consoli | |
| 9,945,569 B2 | 4/2018 | Dinnage | |
| 10,132,569 B2 | 11/2018 | Mockry | |

(Continued)

FOREIGN PATENT DOCUMENTS

| | | |
|---|---|---|
| CA | 3119386 A1 | 6/2020 |
| EP | 1698847 A1 | 1/1929 |

OTHER PUBLICATIONS

Extended European Search Report with regard to the counterpart EP Patent Application No. 21305725.0 completed Nov. 11, 2021.

(Continued)

*Primary Examiner* — Charles S Bushey
(74) *Attorney, Agent, or Firm* — BCF LLP

(57) ABSTRACT

Cooling arrangement and method for cooling of a heat source. The cooling arrangement includes a closed loop, a semi-open loop and at least one fan. The closed loop includes a primary side of a liquid-to-liquid heat exchanger receiving a first cooling fluid heated by the heat source, a first air-to-liquid heat exchanger downstream the primary side, and a first pump returning the first cooling fluid to the heat source. The semi-open loop includes a tank storing a second cooling fluid, a second pump drawing the second cooling fluid from the tank, a secondary side of the liquid-to-liquid heat exchanger receiving the second cooling fluid from the second pump, an evaporating pad downstream said secondary side, and an inlet fluidly connected to a source of the second cooling fluid. The at least one fan causes an air flow through the evaporating pad and through the first air-to-liquid heat exchanger.

15 Claims, 8 Drawing Sheets

(56) References Cited

U.S. PATENT DOCUMENTS

| | | |
|---|---|---|
| 10,808,951 B2 | 10/2020 | Lepoudre et al. |
| 2010/0162737 A1 | 7/2010 | Hall et al. |
| 2015/0153109 A1* | 6/2015 | Reytblat .................. F28D 5/00 |
| | | 62/311 |
| 2018/0135880 A1* | 5/2018 | Ghadiri Moghaddam .................. |
| | | F24F 3/1411 |
| 2018/0224174 A1 | 8/2018 | Hollander et al. |
| 2019/0113247 A1 | 4/2019 | Lepoudre et al. |
| 2020/0284480 A1 | 9/2020 | Tolouei et al. |

OTHER PUBLICATIONS

"Principle of operation", BAC, https://www.baltimoreaircoil.eu/en/products/TVFC-principle-of-operation, Jan. 2, 2021, 2 pages.

"Hybrid dry coolers: a water-saving cooling solution", Insights | Kaltra, https://www.kaltra.com/single-post/2018/04/11/hybrid-dry-coolers, Apr. 11, 2018, 2 pages.

* cited by examiner

COOLING ARRANGEMENT HAVING A CLOSED LOOP, A SEMI-OPEN LOOP AND AT LEAST ONE FAN

CROSS-REFERENCE

The present application claims priority to European Patent Convention Application No. 21305725.0, entitled "Cooling Arrangement Comprising a Closed Loop, a Semi-Open Loop and at Least One Fan," filed on May 31, 2021, the entirety of which is incorporated herein by reference.

FIELD

The present technology relates to the field of cooling equipment. In particular, a cooling arrangement comprising a closed loop, a semi-open loop and at least one fan is disclosed.

BACKGROUND

Dry coolers and other air-to-liquid exchanger systems usually reject thermal energy from a cooling fluid (e.g., water) circulating therethrough to the atmosphere. For example, in a data center, a dry cooler can be used to cool heated water extracted from within the data center (e.g., water circulated through water blocks to collect heat from heat-generating components). In order to improve the efficiency of air-to-liquid exchanger systems, in some cases, direct spraying evaporative cooling techniques can be implemented in order to lower the temperature of (i.e., pre-cool) ambient air that flows through the air-to-liquid exchanger system. For example, in some cases, a water spraying system (i.e., an atomizer) is placed at the air inlet of the dry cooler to spray water and thereby increase humidity of the ambient air and thereby reduce its temperature. Other adiabatic cooling solutions are also available, including for instance evaporating pads on which water is applied and through which ambient air flows prior to entering the air-to-liquid exchanger system.

However, theses solutions may also have various disadvantages. For instance, spraying water by using direct spraying techniques consumes a lot of excessed water, which negatively impacts the Water Usage Effectiveness (WUE) of such solutions and may promote dispersion of pathogenic bacteria such as *Legionella*. Moreover, evaporating pads can obstruct flow of ambient air therethrough which can result in great power consumption and noise emission by the air-to-liquid exchanger system.

There is therefore a desire for a cooling arrangement which can alleviate at least some of these drawbacks. Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In one aspect, various implementations of the present technology provide a cooling arrangement, comprising a close loop, a semi-open loop and at least one fan. The closed loop comprises a primary side of a liquid-to-liquid heat exchanger, the primary side being adapted for receiving a first cooling fluid heated by a heat source, a first air-to-liquid heat exchanger adapted for receiving the first cooling fluid from the primary side of the liquid-to-liquid heat exchanger, and a first pump adapted for receiving the first cooling fluid from the air-to-liquid heat exchanger and for returning the first cooling fluid to the heat source. The semi-open loop comprises a tank adapted for storing a second cooling fluid, a second pump adapted for drawing the second cooling fluid from the tank, a secondary side of the liquid-to-liquid heat exchanger, the secondary side being adapted for receiving the second cooling fluid from the second pump, an evaporating pad adapted for receiving the second cooling fluid from the secondary side of the liquid-to-liquid heat exchanger and to return at least a portion of the second cooling fluid to the tank, and an inlet fluidly connected to a source of the second cooling fluid, the inlet being controlled for maintaining a level of the second cooling fluid in the tank. The at least one fan of the cooling arrangement is adapted for causing an air flow through the evaporating pad and through the first air-to-liquid heat exchanger.

In some implementations of the present technology, the first air-to-liquid heat exchanger, the at least one fan and the evaporating pad are part of a dry cooler.

In some implementations of the present technology, the heat source is located in a data center.

In some implementations of the present technology, the heat source comprises a plurality of heat generating units.

In some implementations of the present technology, the liquid-to-liquid heat exchanger is a plate heat-exchanger.

In some implementations of the present technology, the first air-to-liquid heat exchanger is a finned-tube heat-exchanger.

In some implementations of the present technology, the cooling arrangement further comprises a first sensor of a temperature of the first cooling fluid at an outlet of the first air-to-liquid heat exchanger; and a controller operatively connected to the first sensor, the controller being adapted for increasing a speed of one or more of the first pump, the second pump and the at least one fan in response to the temperature of the first cooling fluid at the outlet of the first air-to-liquid heat exchanger being above a high temperature threshold.

In some implementations of the present technology, the inlet comprises a first valve adapted for causing an inflow of the second cooling fluid from the source to the tank, the cooling arrangement further comprising a second sensor of a level of the second cooling fluid in the tank, the controller being operatively connected to the second sensor and adapted for controlling the first valve in order to maintain the level of the second cooling fluid in the tank above a low level threshold.

In some implementations of the present technology, the semi-open loop further comprises a second valve adapted for regulating a flow of the second cooling fluid to the evaporating pad, the cooling arrangement further comprises a third sensor of a temperature of the air flow entering the evaporating pad, and the controller is operatively connected to the third sensor and adapted for causing the second valve to increase the flow of the second cooling fluid in response to the temperature of the air flow being above a threshold.

In some implementations of the present technology, the first cooling fluid comprises water.

In some implementations of the present technology, the second cooling fluid comprises water.

In some implementations of the present technology, the closed loop further comprises a second air-to-liquid heat exchanger adapted for receiving the first cooling fluid from the heat source, the second air-to-liquid heat exchanger being positioned in the closed loop upstream of the primary side of the liquid-to-liquid heat exchanger.

In some implementations of the present technology, the first and second air-to-liquid heat exchangers are positioned so that the air flow passes through one of the first and second air-to-liquid heat exchangers and then through another of the first and second air-to-liquid heat exchangers.

In some implementations of the present technology, the first and second air-to-liquid heat exchangers are finned-tube heat-exchangers extending along respective planes.

In some implementations of the present technology, each of the first and second air-to-liquid heat exchangers defining an air inlet side and an air outlet side opposed to the air inlet side, the first and second air-to-liquid heat exchangers being adjacent such that the air outlet side of one of the first and second air-to-liquid heat exchangers extends along the air inlet side of another one of the first and second air-to-liquid heat exchangers.

In another aspect, various implementations of the present technology provide a method for cooling of a heat source. The method comprises causing a flow of a first cooling fluid in a closed loop. The closed loop comprises a primary side of a liquid-to-liquid heat exchanger, the primary side being adapted for receiving the first cooling fluid heated by a heat source, a first air-to-liquid heat exchanger adapted for receiving the first cooling fluid from the primary side of the liquid-to-liquid heat exchanger, and a first pump adapted for receiving the first cooling fluid from the air-to-liquid heat exchanger and for returning the first cooling fluid to the heat source. The method further comprises causing a flow of a second cooling fluid in a semi-open loop. The semi-open loop comprises a tank adapted for storing the second cooling fluid, a second pump adapted for drawing the second cooling fluid from the tank, a secondary side of the liquid-to-liquid heat exchanger, the secondary side being adapted for receiving the second cooling fluid from the second pump, an evaporating pad adapted for receiving the second cooling fluid from the secondary side of the liquid-to-liquid heat exchanger and to return at least a portion of the second cooling fluid to the tank, and an inlet fluidly connected to a source of the second cooling fluid. The method further comprises controlling the inlet for maintaining a level of the second cooling fluid in the tank; and controlling at least one fan for causing an air flow through the evaporating pad and through the first air-to-liquid heat exchanger.

In some implementations of the method, the method further comprises sensing a temperature of the first cooling fluid returning to the heat source; and increasing a speed of one or more of the first pump, the second pump and the at least one fan in response to the temperature being higher than a threshold.

In some implementations of the method, the method further comprises sensing a level of the second cooling fluid in the tank; and causing a first valve to increase an inflow of the second cooling fluid from the source to the tank in response to the level of the second cooling fluid in the tank being below a low level threshold.

In some implementations of the method, the method further comprises sensing a temperature of the air flow entering the evaporating pad; and causing one or more of a second valve and the second pump to increase a flow of the second cooling fluid to the evaporating pad in response to the temperature of the air flow being above a threshold.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
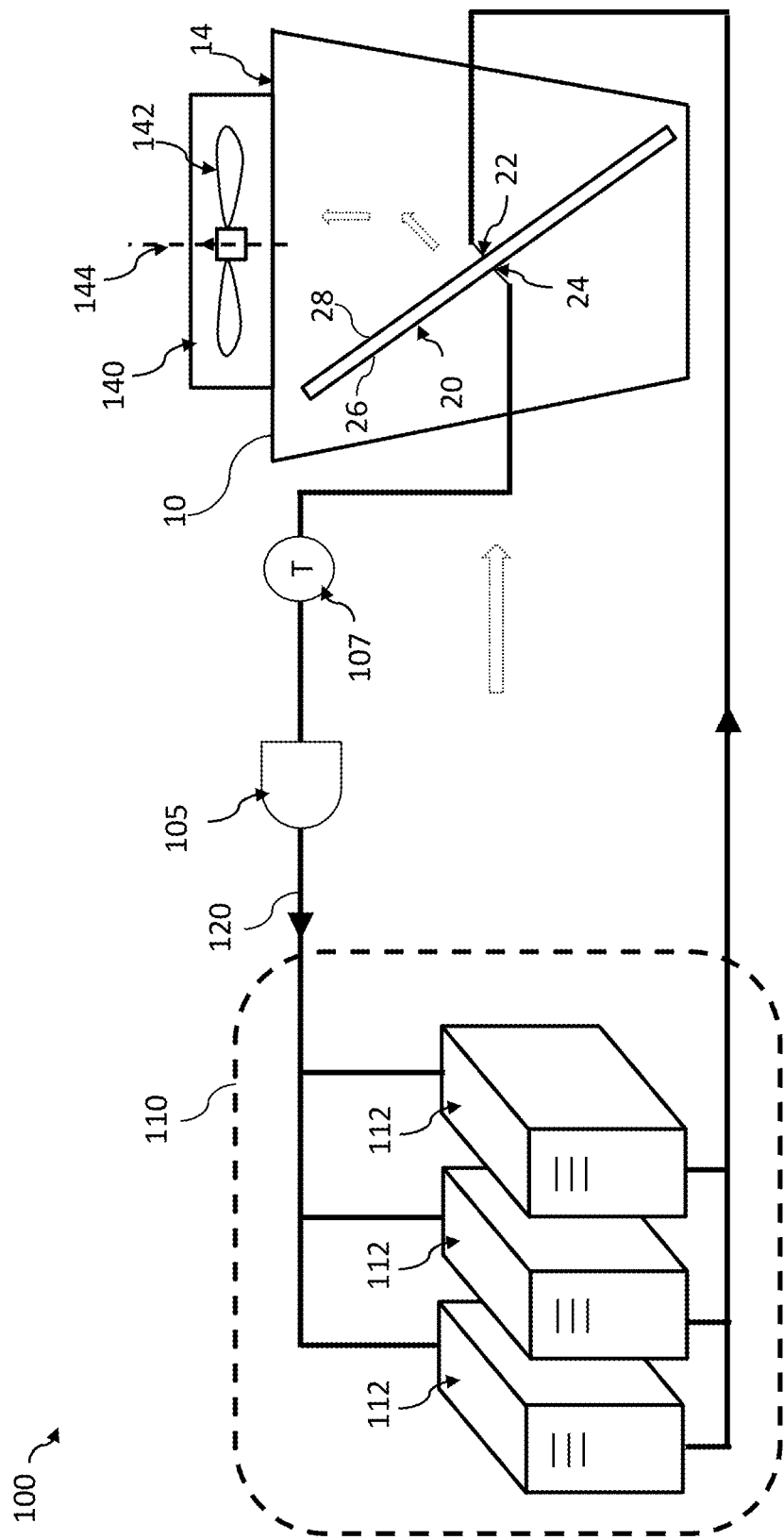
FIG. 1 illustrates a cooling arrangement for a heat source.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In an aspect, the present technology provides a cooling arrangement. The cooling arrangement comprises a closed loop, a semi-open loop, and at least one fan. The closed loop comprises a primary side of a liquid-to-liquid heat exchanger, the primary side being receiving a first cooling fluid from a heat source, for instance heat generating units of a datacenter. The first cooling fluid may be, for example, water or any other suitable cooling fluid. The closed loop also comprises an air-to-liquid heat exchanger receiving the first cooling fluid from the primary side of the liquid-to-liquid heat exchanger. The air-to-liquid heat exchanger may be, for instance, a part of a dry cooler. The closed loop also comprises a first pump receiving the first cooling fluid from the air-to-liquid heat exchanger and returning the first cooling fluid to the heat source. The semi-open loop comprises a tank storing a second cooling fluid. The second cooling fluid may be, for example, water or any other suitable cooling fluid. The semi-open loop also comprises a second pump drawing the second cooling fluid from the tank and a secondary side of the liquid-to-liquid heat exchanger. The secondary side receives the second cooling fluid from the second pump. The semi-open loop also comprises an evaporating pad receiving the second cooling fluid from the secondary side of the liquid-to-liquid heat exchanger and returning at least a portion of the second cooling fluid to the tank, and an inlet fluidly connected to a source of the second cooling fluid, the inlet being controlled for maintaining a level of the second cooling fluid in the tank. The cooling arrangement comprises at least one fan causing outside air to flow through the evaporating pad and through the air-to-liquid heat exchanger.

With these fundamentals in place, we will now consider some non-limiting examples to illustrate various implementations of aspects of the present technology.

In a non-limiting embodiment of the present technology, a cooling arrangement includes a distribution system for watering an evaporating pad used for cooling a cooling fluid via a liquid-to-liquid heat exchanger. Said liquid-to-liquid heat exchanger may be, for example and without limitation, a plate heat-exchanger (PHEX). The distribution system is a semi-open loop where water streaming down the evaporating pad is collected in a tank where it may be cooled with low-temperature makeup water such as, for instance and without limitation, tap water. The distribution system pumps cooled water from the tank into the liquid-to-liquid heat exchanger where thermal energy is transferred from the cooling fluid arriving from the heat source, for example and without limitations a data center, to the water entering the PHEX from the tank. Cooling fluid arriving from the heat source is thus pre-cooled and enters an air-to-liquid heat exchanger such as, for example and without limitation, a heat exchanger panel of a dry cooler, and is cooled down by air pulled by one or more fans through the air-to-liquid heat exchanger. For instance and without limitation, the air-to-liquid heat exchanger may part of a dry cooler comprising fans to pull ambient air through the air-to-liquid heat exchanger. Thermal energy is thus transferred from the pre-cooled cooling fluid to the atmosphere so that the pre-cooled cooling fluid is recirculated back to the heat source.

The additional pre-cooling of the cooling fluid arriving from the heat source at the PHEX uses the distribution system. As a result, efficient cooling may be obtained with reduced air flow on the evaporating pad and through the dry cooler. An electrical consumption and a noise emission of fans of the dry cooler may thus be reduced. As it will be described in greater details herein further below, even a small ratio of the thermal dissipation acting on the PHEX is sufficient to significantly reduce the fans' electrical consumption and noise emission.

FIG. 1 illustrates a cooling arrangement 100 providing cooling to a heat source 110, the heat source 110 generating thermal energy. For instance, the heat source 110 may be a datacenter comprising a plurality of heat generating components 112 (e.g. servers). The cooling arrangement comprises a closed loop 120. A first cooling fluid circulates therein, the first cooling fluid being collecting thermal energy generated by the heat source 110, namely the servers 112 in this example, and carries said thermal energy to a heat exchanger 10 to discharge the thermal energy. A pump 105 is used to recirculate the first cooling fluid from the heat exchanger 10 back to the heat source 110.

In this example, the heat exchanger system 10 is a dry cooler. However, it is con-templated that the heat exchanger system 10 may be any other suitable type of heat exchanger system (e.g., a chiller). In the example of FIG. 1, the dry cooler 10 includes a frame 14 for supporting components of the dry cooler 10. The frame 14 may be anchored to a support surface (e.g. a ground surface) by fasteners. The support surface may be any suitable support surface. For instance, in this illustrative example, the support surface is a surface surrounding a building or a roof of a building (e.g., a building housing a data center). However, in other examples, the support surface could be part of a structure purposefully built to support the frame 14.

In the example depicted in FIG. 1, the heat exchanger 10 comprises a heat exchanger panel 20 for discharging thermal energy of the first cooling fluid into the atmosphere. In particular, the heat exchanger panel 20 is a liquid-to-air heat exchanger panel 20 that transfers thermal energy from the first cooling fluid circulating therein to the air flowing therethrough. As shown in FIG. 1, the heat exchanger panel 20 has an air inlet side 26 and an air outlet side 28 through which, in use, air enters and exits the heat exchanger panel 20 respectively.

The heat exchanger panel 20 comprises a cooling coil (not shown) for circulating the first cooling fluid therein and a plurality of fins (not shown) in thermal contact with the cooling coil. The cooling coil has an inlet 22 and an outlet 24, as depicted in FIG. 1, for feeding the first cooling fluid into and discharging the heat transfer fluid from the cooling coil. The fins may be spaced from one another for air to flow therebetween, from the air inlet side 26 to the air outlet side 28.

The dry cooler 10 comprises a fan assembly 140 connected to the frame 14 and causing an air flow through the dry cooler 10. In particular, the fan assembly 140 comprises a plurality of fans 142 (one of which is shown in FIG. 1) located at an upper end of the dry cooler 10. In this example, the fans 142 are rotatable about respective vertical axes 144.

The fan assembly 140 includes respective motors (not shown) driving each of the fans 142 to cause rotation of the fans 142 about their respective axes 144. Thus, as denoted by air flow arrows in FIG. 1, the fan assembly 140 pulls ambient air from a lateral side of the dry cooler 10, through the heat exchanger panel 20, and rejects heated air through the fan assembly 140 out into the atmosphere vertically above the dry cooler 10.

The dry cooler 10 thus functions by pumping heated first cooling fluid extracted from the heat source 110 (e.g. a data center in this example) through the cooling coils of the heat exchanger panel 20, while simultaneously pulling ambient air between the fins and around the cooling coil of the heat exchanger panel 20. The ambient air absorbs heat from the heated first cooling fluid circulating through the cooling coils. As ambient air is pulled in through the heat exchanger panel 20 into an interior space of the dry cooler 10, thermal energy is transferred from the first cooling fluid circulating in the heat exchanger panel 20 to the ambient air. The now-heated air is then discharged from the interior space of the dry cooler 10 through the fan assembly 140. The first cooling fluid circulating in the heat exchanger panel 20 is thus cooled and is recirculated back into the heat source 110. In this example, the closed loop 120 further comprises a sensor 107 of a temperature of the first cooling fluid at the outlet 24 of the heat exchanger panel 20. The sensor 107 may be communicably connected to an electronic controller 500 (FIG. 8) for increasing a speed of the first pump and/or the fan 142 in response to the temperature of the first cooling fluid at the outlet 24 of the heat exchanger panel 20 being above a first high fluid temperature threshold.

While in this example the first cooling fluid flowing in the closed loop 120 may be water, the first cooling fluid may be a dielectric fluid, a refrigerant fluid, a diphasic fluid or any other fluid suitable for collecting and discharging thermal energy.

It will be appreciated that the configuration of the dry cooler 10 as described above is provided merely as an example to aid in understanding the present technology. The dry cooler 10 may be configured differently in other examples. For instance, a plurality of heat exchanger panels 20 may be provided, and the fan assembly 140 may include a single fan 142. Moreover, the fans 142 may be oriented such that their respective fan rotation axes 144 extend horizontally, or at angle between horizontal and vertical.

Figure 2:
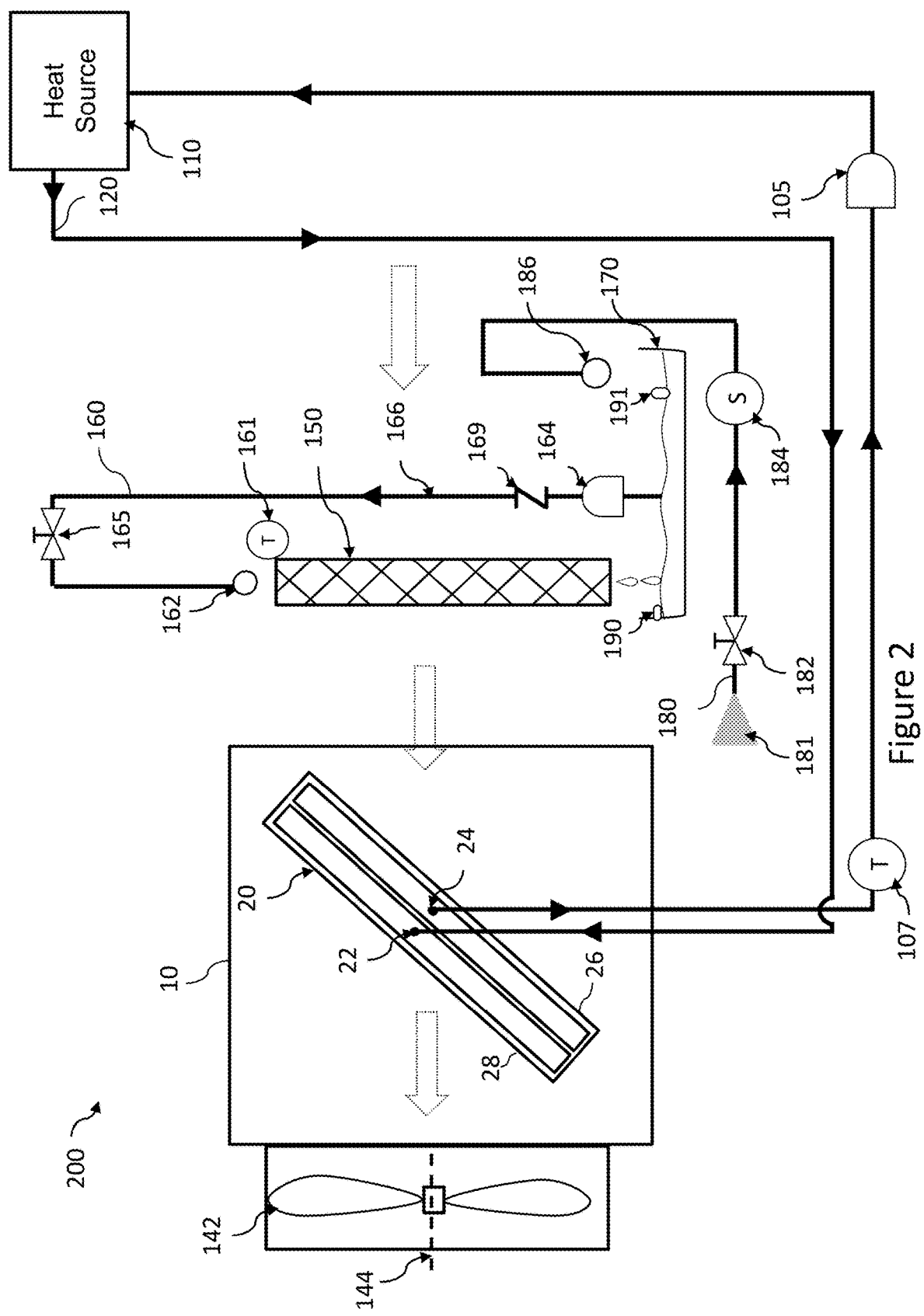
FIG. 2 illustrates an adiabatic cooling system in a cooling arrangement for a heat source.

An adiabatic cooling system for use with the dry cooler 10 will now be described. FIG. 2 illustrates a cooling arrangement 200 including an adiabatic cooling system of the heat exchanger 10. In the example of FIG. 2, the fan rotation axis 144 extends horizontally. The adiabatic cooling system, which is added to the cooling arrangement 100, includes an evaporating pad 150 and a distribution system 160 for spraying a second cooling fluid on the evaporating pad 150. The second cooling fluid may be water, possibly with additives such as polyethylene glycol (PEG) and/or polypropylene glycol (PPG). With reference to FIG. 2, the evaporating pad 150 is disposed on a lateral side of the dry cooler 10. In one embodiment, the frame 14 of the dry cooler 10 comprises an enclosure for supporting the evaporating pad 150 such that, in use, ambient air pulled by the fan 142 is conducted by the enclosure from the evaporating pad 150 to the heat exchanger panel 20.

The distribution system 160 distributes the second cooling fluid in a surrounding environment of the dry cooler 10, notably, in this example, onto the evaporating pad 150, such that ambient air flows through the wet evaporating pad 150. Temperature of ambient air flowing through the evaporating pad 150 thus decreases as a portion of the second cooling fluid (e.g. water droplets) distributed on the evaporating pad 150 evaporates. Thermal energy of the ambient air is thus absorbed by evaporation of the portion of the second cooling fluid such that the air flow's temperature is reduced. The evaporating pad 150 may be made of plastic material, cellulose, or glass fibers, but other materials are also contemplated in alternative embodiments. In this embodiment, the distribution system 160 includes a nozzle 162 for distributing the second cooling fluid (e.g. by spraying the second cooling fluid) on the evaporating pad 150.

The distribution system 160 also comprises a tank 170 positioned beneath the evaporating pad 150 to collect portion of the second cooling fluid that is not evaporated and that is streaming down the evaporating pad 150. The distribution system 160 comprises a makeup distribution system 180 to provide makeup second cooling fluid in the tank 170 at a predetermined temperature. The makeup distribution system 180 comprises an inlet 181 (e.g. the makeup distribution system 180 may for example be connected to a municipal water distribution system operating on low pressure—e.g. 3-4 bars), a valve 182 for controlling an inflow of the makeup second cooling fluid in the tank 170, one or more sensors 184 and an outlet 186 for pouring the makeup second cooling fluid in the tank 170. The one or more sensors 184 may comprise a temperature sensor, a flow rate sensor, a water meter for measuring a volume of the makeup second cooling fluid supplied by the makeup distribution system 180 to the tank 170, or any other suitable sensors. In some embodiments, the valve 182 is a solenoid valve. In alternative embodiments, the valve 182 may be a floating ball valve.

In one example, the distribution system 160 also comprises a sensor 190 of a level of the second cooling fluid in the tank 170. For example, the sensor 190 may comprise a float mounted in the tank 170, such that the valve 182 may be opened when a level of water in the tank 170 is below a low level threshold. A temperature sensor 191 may sense a temperature of the second cooling fluid in the tank 170 so that the valve 182 may be opened when the temperature is higher than a second high fluid temperature threshold and a level of water in the tank 170, measured by the sensor 190, is below a high level threshold. The valve 182 may be controlled by the sensors 190 and/or 191 or by the electronic controller 500 (FIG. 8), communicably connected with the valve 182 and the sensors 190 and/or 191, receiving signals indicative of a level of the second cooling fluid in the tank 170 sensed by the sensor 190 and/or signals indicative of a temperature of the second cooling fluid in the tank 170.

The distribution system 160 comprises a conduit 166 for circulating the second cooling fluid from the tank 170 to the nozzle 162. The conduit 166 may comprise a filter (not shown) to eliminate any undesirable particles before a distribution of the second cooling fluid on the evaporating pad 150. In this embodiment, the distribution system 160 also includes a pump 164 for pumping the second cooling fluid through the conduit 166. The second cooling fluid from the tank 170 circulates in the conduit 166 for watering the evaporating pad 150.

In this embodiment, the distribution system 160 operates such that the second cooling fluid distributed by the nozzle 162 has a relative outlet pressure below 5 bars (e.g. 1.5 bars). Since the distribution system 160 operates on such low pressure, the pump 164 is relatively inexpensive. Moreover, spraying water at low pressure reduces the likelihood of causing the dispersion of pathogenic organisms. As such, the distribution system 160 is compliant with regulations in jurisdictions in which high pressure liquid and/or fluid spraying is not permitted. The distribution system 160 comprises a valve 165 upstream of the nozzle 162 for regulating an inflow of the second cooling fluid on the evaporating pad 150.

While in some embodiments the distribution system 160 may continuously distribute the second cooling fluid onto the evaporating pad 150, this may be wasteful. For example, the electronic controller 500 may control the spraying of water by the nozzle 162 based on a set timer (e.g., every 5 minutes). Alternatively, in some embodiments, the cooling arrangement 200 may comprise a temperature sensor 161 of a temperature of an air flow entering the evaporating pad 150, the temperature sensor 161 being communicably connected to the electronic controller 500 such that the electronic controller 500 causes the valve 165 to increase a flow of the second cooling fluid in response to the temperature of the air flow being above a high air temperature threshold. In alternative embodiments, the temperature sensor 161 may sense a temperature of the air flow exiting the evaporating pad 150. Additionally or alternatively, the electronic controller 500 may, for example, increase a speed of the pump 164 in response to the temperature of the air flow being above the high air temperature threshold. Other environmental parameters may be contemplated in alternative embodiments such as humidity or speed of the air flow entering the evaporating pad 150, the electronic controller 500 may control the flow of the second cooling fluid on the evaporating pad 150 according to specific operating conditions.

It will be appreciated that the configuration of the adiabatic cooling system of FIG. 2 as described above is provided merely as an example to aid in understanding the present technology. The adiabatic cooling system may be configured differently in other embodiments. For instance, in other embodiments, a plurality of evaporating pad 150 may be provided, and the evaporating pad 150 may have a different shape than the one depicted in FIG. 2.

Figure 3:
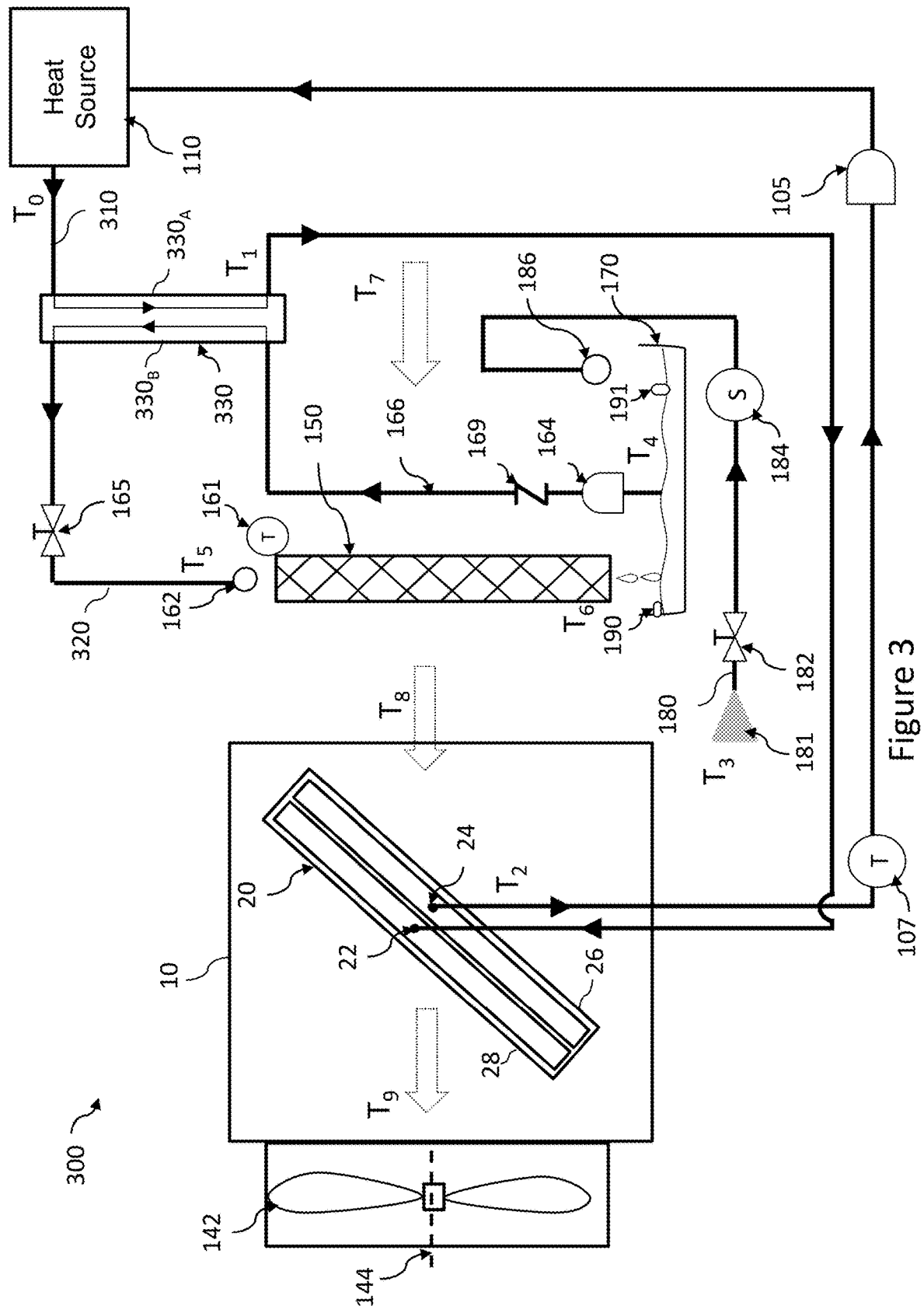
FIG. 3 illustrates a cooling arrangement in accordance with an embodiment of the present technology.

As previously mentioned, such use of the evaporating pad 150 may obstruct flow of ambient air through the heat exchanger panel 20 which can result in great power consumption and noise emission by the fan 142 of the heat exchanger 10. A cooling arrangement comprising the evaporating pad 150 and the distribution system 160 described in FIG. 2, as well as an additional liquid-to-liquid heat exchanger will now be described in greater detail. FIG. 3 illustrates cooling arrangement 300 in accordance with an embodiment of the present technology. The cooling arrangement 300 comprises a closed loop 310 and a semi-open loop 320. It should be understood that the term "closed loop" should not be deemed to restrict the closed loop 310 as being absolutely closed. Indeed, in some embodiment, the closed loop 310 may be fluidly connected to a source of a cooling fluid flowing in the closed loop 310.

In this embodiment, the closed loop 310 comprises a primary side $330_A$ of a liquid-to-liquid heat exchanger 330. The primary side $330_A$ receives the first cooling fluid from the heat source 110. In a non-limiting embodiment, the first cooling fluid flowing in the closed loop 310 may comprise water, possibly with additives such as polyethylene glycol (PEG) and/or polypropylene glycol (PPG). In a non-limiting embodiment, the liquid-to-liquid heat exchanger 330 may be a plate heat exchanger (PHEX). In an illustrative embodiment, the first cooling fluid is at temperature $T_0$ before entering the liquid-to-liquid heat exchanger 330, To being between 47° C. and 57° C.

The closed loop 310 also comprises the air-to-liquid heat exchanger 20 that receives the first cooling fluid from the primary side of the liquid-to-liquid heat exchanger 330. In one embodiment, the air-to-liquid heat exchanger 20 may be a finned-tube heat exchanger. In this illustrative embodiment, the first cooling fluid is at temperature $T_1$ before entering the air-to-liquid heat exchanger 20, $T_1$ being between 40° C. and 56° C. The air-to-liquid heat exchanger 20 may be a part of the dry cooler 10 previously described.

The pump 105 receives the first cooling fluid from the air-to-liquid heat exchanger 20 and return the first cooling fluid to the heat source 110. In use, thermal energy generated by the heat source 110 is collected by the first cooling fluid, brought through the primary side $330_A$ of the liquid-to-liquid heat exchanger 330 and into the air-to-liquid heat exchanger 20 such that at least a part of the thermal energy is discharged into surrounding air of the air-to-liquid heat exchanger 20. The first cooling fluid is further recirculated back to the heat source 110 by the first pump 314. In this illustrative embodiment, the first cooling fluid is at temperature $T_2$ before entering back in thermal contact with the heat source 110, $T_2$ being between 27° C. and 37° C. The closed loop 310 is similar to the closed loop 120 described in FIG. 1 where the heat transfer fluid of the first closed loop 310 further flows through the primary side $330_A$ of the liquid-to-liquid heat exchanger 330 before reaching the air-to-liquid heat exchanger 20.

The semi-open loop 320 comprises the components of the distribution system 160 and the evaporating pad 150 described above, that will therefore be referred to with the same reference numerals, and further comprises a secondary side $330_B$ of the liquid-to-liquid heat exchanger 330. More specifically, the semi-open loop 320 comprises the tank 170, the pump 164, the evaporating pad 150 and the inlet 181, in addition to the secondary side $330_B$ of the liquid-to-liquid heat exchanger 330. In this embodiment, the tank 170 stores the second cooling fluid such that the pump 164 draws the second cooling fluid from the tank 170. In a non-limiting embodiment, the second cooling fluid flowing in the semi-open loop 320 comprises water and may further comprise additives such as polyethylene glycol (PEG) and/or polypropylene glycol (PPG). In this illustrative embodiment, the second cooling fluid is at temperature $T_4$ in the tank 170, $T_4$ being between 10° C. and 40° C.

In this embodiment, the first and second cooling fluids are thermally connected in the liquid-to-liquid heat exchanger 330. A first portion of the thermal energy collect by the first cooling fluid from the heat source 110 is thus transferred to the second cooling fluid in the liquid-to-liquid heat exchanger 330. In this illustrative embodiment, the second cooling fluid is at a temperature $T_5$ downstream the liquid-to-liquid heat exchanger 330, $T_5$ being between 44° C. and 54° C.

The first cooling fluid is pre-cooled in the liquid-to-liquid heat exchanger 330 before being directed to the air-to-liquid heat exchanger 20 as it will be described in greater details herein further below. The second cooling fluid thus acts as a "sacrificial cooling fluid" as it receives thermal energy from the first cooling fluid before being distributed on the evaporating pad 150.

The second cooling fluid is further distributed on the evaporating pad 150 such that a portion of the second cooling fluid evaporates with a flow of ambient air therethrough, causing the ambient air to cool down before capturing thermal energy of the first cooling fluid at the air-to-liquid heat exchanger 20. In this illustrative embodiment, the ambient air surrounding the heat exchanger 10 is at a temperature $T_7$, $T_7$ being between 25° C. and 47° C. Upon flowing through the evaporating pad 150, the ambient air is pre-cooled due to evaporation of a portion of the second cooling fluid. In this illustrative embodiment, the pre-cooled air exiting the evaporative pad 150 is at a temperature $T_8$, $T_8$ being between 24° C. and 34° C. A portion of the second cooling fluid that is not evaporated streams down into the tank 170. In this illustrative embodiment, the second cooling fluid is at a temperature $T_6$ upon streaming from the evaporating pad 150 and being collected in the tank 170, $T_6$ being between 24° C. and 47° C. Indeed, the temperature of the portion of the second fluid that is not evaporated may be reduced by the air flow pulled through the evaporating pad 150, and/or by a latent heat of vaporization consumed by the portion of the second fluid that is evaporated, such that, in some implementation, it may reach a temperature close to $T_8$. The inlet 181 is controlled for maintaining a level of the second cooling fluid in the tank 170. In this illustrative embodiment, the inlet 181 provides second cooling fluid (e.g. tap water) at a temperature $T_3$ being between 10° C. and 20° C.

More specifically, in this embodiment, the cooling arrangement 300 comprises the sensors 190 and 191 of the level of the second cooling fluid in the tank 170 and of the temperature of the second cooling fluid in the tank 170 respectively, and the electronic controller 500 operatively connected to the sensor 190. In this embodiment, the cooling arrangement 300 also comprises the temperature sensor 161 communicably connected to the electronic controller 500 such that the electronic controller 500 may cause the valve 165 and/or the pump 164 to increase a flow of the second cooling fluid in response to the temperature of the air flow being above the high air temperature threshold.

The cooling arrangement 300 also comprises at least one fan 142 as shown in FIG. 3, the fan 142 causing outside air to flow through the evaporating pad 150 and through the air-to-liquid heat exchanger 20. A second portion of the thermal energy collected by the first cooling fluid from the heat source 110 is thus transferred to the ambient air in the air-to-liquid heat exchanger 20. In this illustrative embodiment, the air exiting the air-to-liquid heat exchanger 20 is at a temperature $T_9$ between 31° C. and 41° C.

In this embodiment, the cooling arrangement 300 comprises the sensor 107 of a temperature of the first cooling fluid at the outlet 24 of the air-to-liquid heat exchanger 20. In this embodiment, the electronic controller 500 is further operatively connected to the sensor 107 such that the electronic controller 500 may control one or more of the first pump 314, the second pump 164 and the fan 142 to maintain the temperature of the first cooling fluid at the outlet 24 of the air-to-liquid heat exchanger 20 below the high temperature threshold.

Figure 4:
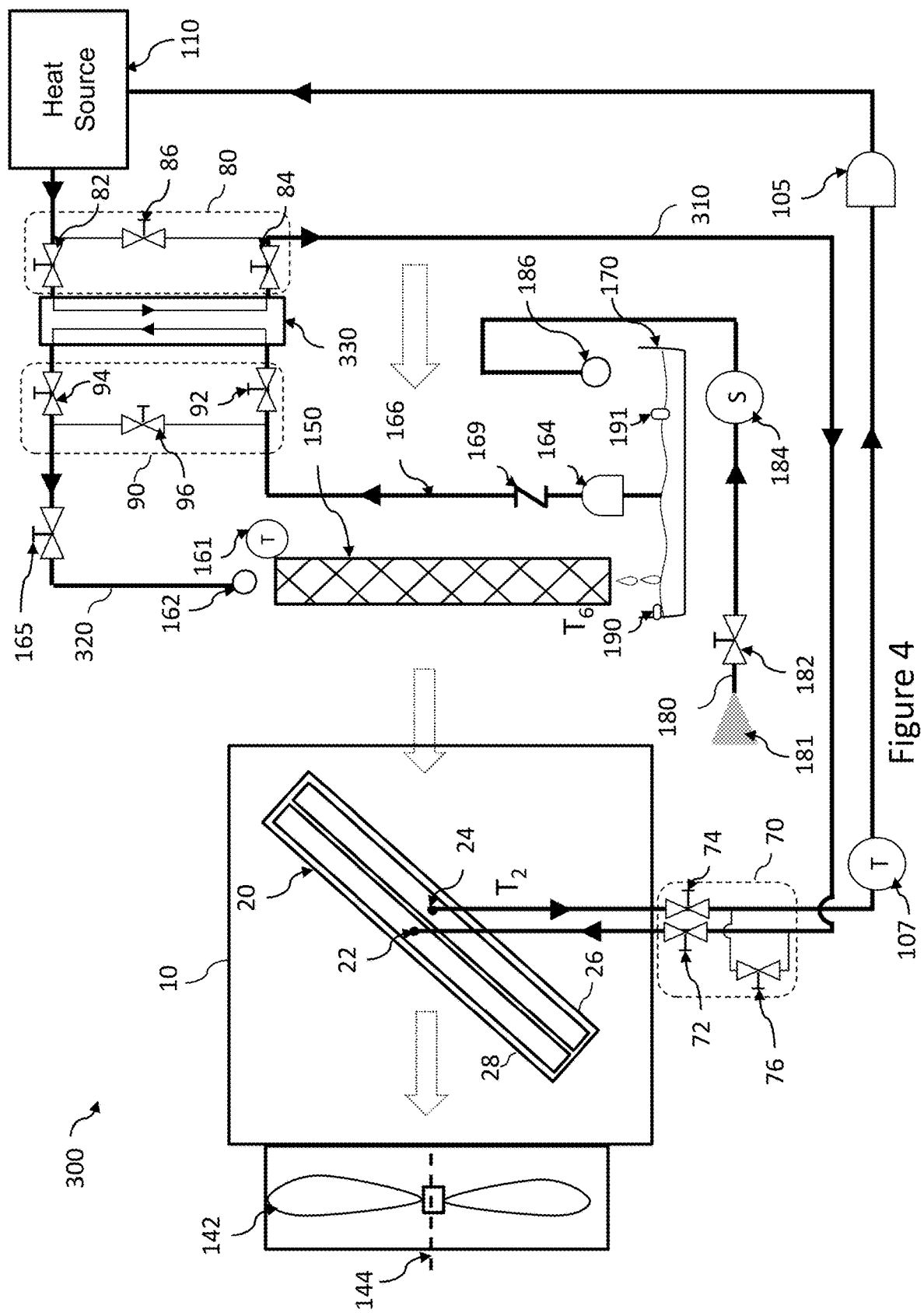
FIG. 4 illustrates a cooling arrangement in accordance with another embodiment of the present technology.

Additionally, as best shown on FIG. 4, the closed loop 310 comprises, in this illustrative embodiment, two bypass arrangements 70 and 80 such that the first cooling fluid may selectively bypass the air-to-liquid heat exchanger 20 and the liquid-to-liquid heat exchanger 330 when one of the components of the closed loop 310 fails. More specifically, the bypass arrangement 70 comprises two valves 72 and 74 configured to be closed, and a valve 76 configured to be open to selectively bypass the air-to-liquid heat exchanger 20. Similarly, the bypass arrangement 80 comprises two valves 82 and 84 configured to be closed, and a valve 86 configured to be open to selectively bypass the primary side $330_A$ of the liquid-to-liquid heat exchanger 330. In this embodiment, the valves 72, 74 and 76 are manually operated and the valves 82, 84 and 86 may be communicably connected to and controlled by the electronic controller 500 based on, for example, on a temperature of the ambient air in a vicinity of the evaporating pad 150, such that a reliance of the cooling arrangement 300 on the evaporating pad 150 may be controlled by the electronic processor.

In the embodiment of FIG. 4, the semi-open loop 320 also comprises a bypass arrangement 90, such that the second cooling fluid may selectively bypass the liquid-to-liquid heat exchanger 330 when one of the components of the semi-open loop 320 fails. More specifically, the bypass arrangement 90 comprises two valves 92 and 94 configured to be closed, and a valve 96 configured to be open to selectively bypass the secondary side $330_B$ of liquid-to-liquid heat exchanger 330. The electronic controller 500 may be communicably connected to the valves 72, 74, 76, 82, 84, 86, 92, 94 and 96 to open or close one or more of those valves in response to a detection of a failure of one or more of the air-to-liquid heat exchanger 20, the primary or the secondary side $330_A$, $330_B$ of the liquid-to-liquid heat exchanger 330. In the same or another embodiment, the semi-open loop 320 may comprise a humidity sensor (not shown) for measuring a humidity level of the air exiting the evaporating panel 150. The humidity sensor may be communicably connected to the electronic controller 500 such that the latter may open one or more of the valves 182, 165, 82, 84, and 86, open the inlet 181, adjust a speed of the pump 164 and/or adjust a rotation speed of the fan 142 in response to the level of humidity being lower than a humidity threshold.

Figure 5:
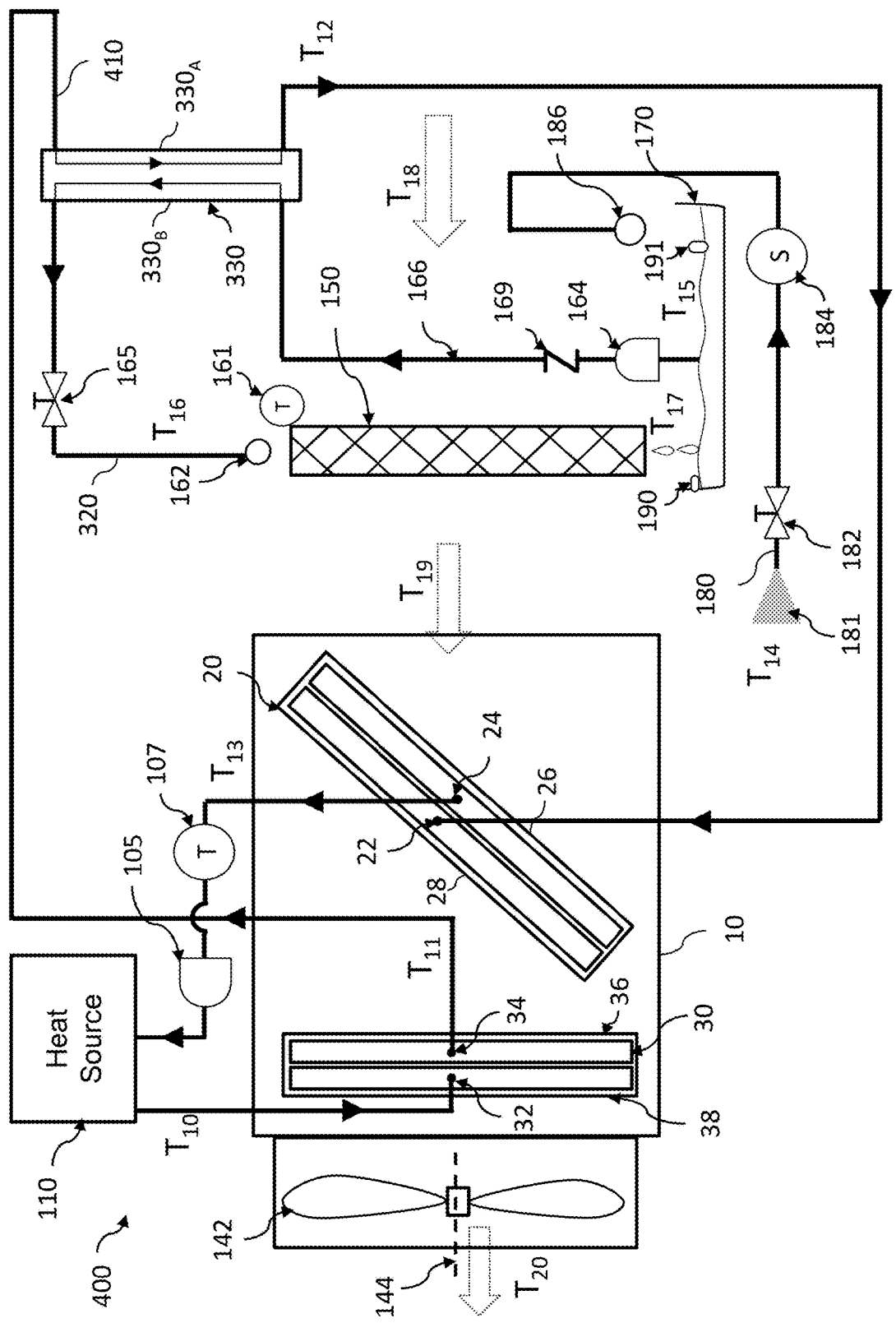
FIG. 5 illustrates a cooling arrangement in accordance with another embodiment of the present technology.
Figure 6:
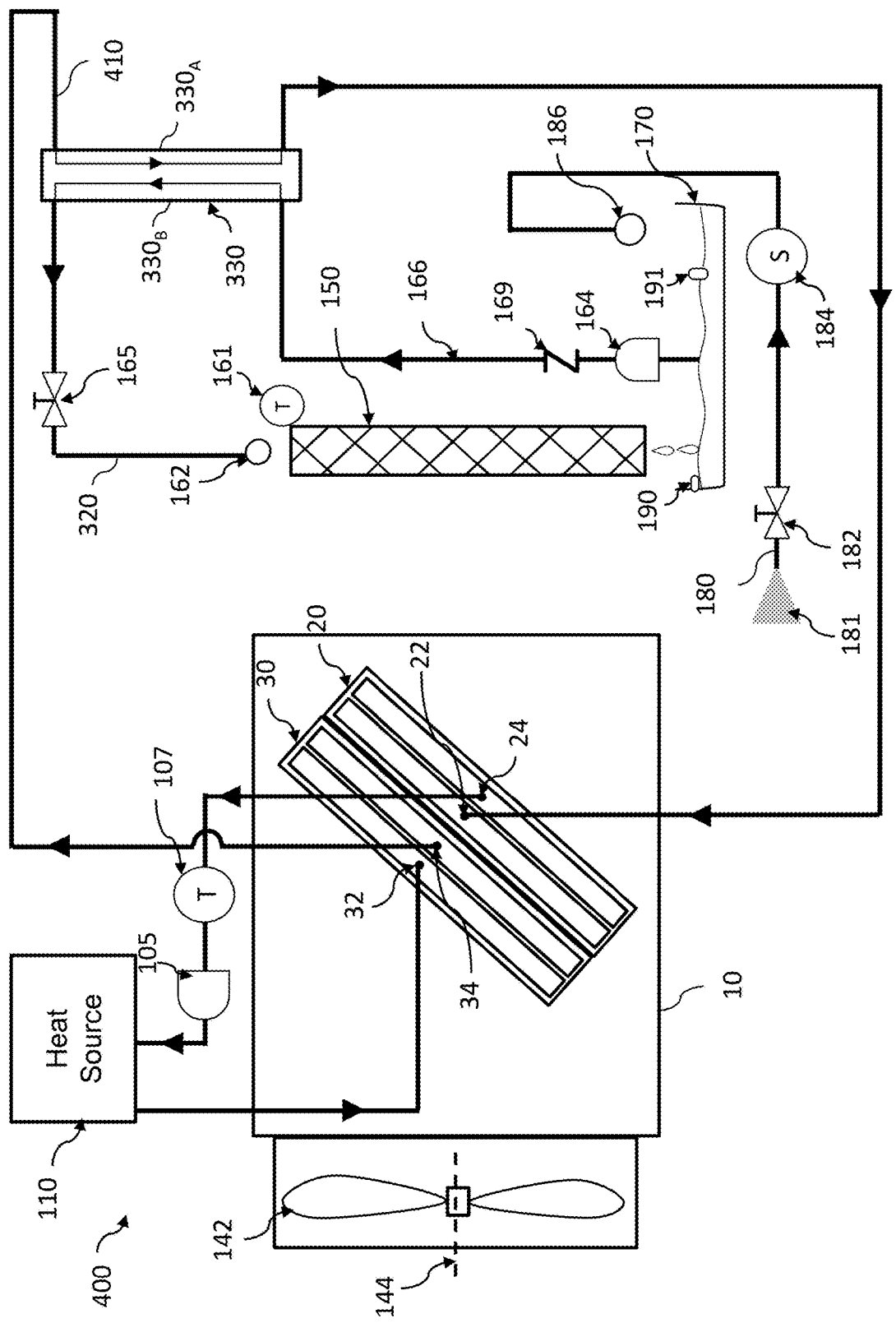
FIG. 6 illustrates a cooling arrangement in accordance with another embodiment of the present technology.

A cooling arrangement 400 comprising a closed loop 410 and the semi-open loop 320 described in FIGS. 3 and 4 will now be described. The closed loop 410 comprises the components of the closed loop 310 described above, that will therefore be referred to with the same reference numerals, and further comprises an additional air-to-liquid heat exchanger 30. FIGS. 5 and 6 illustrate a cooling arrangement 400 in accordance with embodiments of the present technology. In order to ease a reading of the present disclosure, a cooling fluid flowing in the closed loop 410 will be referred to as the first cooling fluid, due to similarities of the closed loops 310 and 410.

More specifically, in the illustrative embodiments depicted in FIGS. 5 and 6, the additional air-to-liquid heat exchanger 30 is a heat exchanger panel for discharging thermal energy of the first cooling fluid into the atmosphere. The air-to-liquid heat exchanger 30 transfers thermal energy from the first cooling fluid circulating therein to the air flowing therethrough. Addition in the closed loop 410 of the air-to-liquid heat exchanger 30 provides redundancy to the air-to-liquid heat exchanger 20. As shown in FIG. 5, the air-to-liquid heat exchanger 30 has an air inlet side 36 and an air outlet side 38 through which, in use, air enters and then exits the air-to-liquid heat exchanger 30.

Similarly to the air-to-liquid heat exchanger 20, the air-to-liquid heat exchanger 30 comprises a cooling coil (not shown) for circulating the first cooling fluid therein and a plurality of fins (not shown) in thermal contact with the cooling coil. The cooling coil has an inlet 32 and an outlet 34, as depicted in FIGS. 5 and 6, for feeding the first cooling fluid into and discharging the heat transfer fluid from the cooling coil. The fins may be spaced from one another for air to flow therebetween, from the air inlet side 36 to the air outlet side 38.

In the embodiments of FIGS. 5 and 6, the air-to-liquid heat exchanger 30 receives the first cooling fluid from the heat source 110 and is positioned in the closed loop 410 upstream of the primary side $330_A$ of the liquid-to-liquid heat exchanger 330. Moreover, the air-to-liquid heat exchangers 20, 30 are positioned so that the air flow passes through the air-to-liquid heat exchanger 20 and then through the air-to-liquid heat exchanger 30. A reverse arrangement causing the air flow to first pass through the air-to-liquid heat exchanger 30 and then through the air-to-liquid heat exchanger 20 is also contemplated. The air-to-liquid heat exchanger 30 may be, for instance, disposed in the dry cooler 10.

More specifically, with reference to FIG. 5, the first cooling fluid flowing in the closed loop 410 is heated at a temperature $T_{10}$ before entering the air-to-liquid heat exchanger 30. The first cooling fluid is thus cooled down to a temperature of $T_{11}$ before entering the primary side $330_A$ of the liquid-to-liquid heat exchanger 330. The air-to-liquid heat exchanger 20 receives the first cooling fluid from the primary side $330_A$ of the liquid-to-liquid heat exchanger 330 at a temperature of $T_{12}$. The first cooling fluid is at temperature $T_{13}$ upon entering back in thermal contact with the heat source 110. In the cooling arrangement 400, the inlet 181 provides second cooling fluid at a temperature $T_{14}$, the second cooling fluid being stored in the tank 170 having a temperature $T_{15}$. As such, the pump 164 draws the second cooling fluid from the tank 170 to the secondary side $330_B$ of the liquid-to-liquid heat exchanger 330 to receive a portion of the thermal energy from the first cooling fluid, as described hereinbefore. The second cooling fluid exits the secondary side $330_B$ of the liquid-to-liquid heat exchanger 330 at a temperature $T_{16}$ and is distributed over the evaporating pad. The non-evaporated portion of the second cooling fluid is collected in the tank 170 at a temperature $T_{17}$. Temperature of the air flow of ambient air entering in the evaporating pad 150 is noted $T_{18}$. The air flow is thus cooled to a temperature $T_{19}$ before passing through the air-to-liquid heat exchanger 20, and then trough the air-to-liquid heat exchanger 30. The air flow thus collects thermal energy of the first cooling fluid before being expelled by the fan 142 at a temperature $T_{20}$.

Table I shows design values for the cooling arrangement 300 as described in FIG. 3, and for the cooling arrangement 400 as described in FIG. 5. Therefore, the following values are indicative of an effect of the additional air-to-liquid heat exchanger 30 in the cooling arrangement 300. The shown values obtained using the cooling arrangements 300 and 400 are merely examples and do not set forth boundaries and/or limitations of the present technology.

TABLE I

| Cooling Arrangement 300 | | Cooling Arrangement 400 | |
|---|---|---|---|
| $T_0$ | 52° C. | $T_{10}$ | 52° C. |
|  |  | $T_{11}$ | 45° C. |
| $T_1$ | 49.5° C. | $T_{12}$ | 43° C. |
| $T_2$ | 32° C. | $T_{13}$ | 32° C. |
| $T_3$ | 15° C. | $T_{14}$ | 15° C. |
| $T_4$ | 35° C. | $T_{15}$ | 29° C. |
| $T_5$ | 49° C. | $T_{16}$ | 42° C. |
| $T_6$ | 42° C. | $T_{17}$ | 34.5° C. |
| $T_7$ | 42° C. | $T_{18}$ | 42° C. |
| $T_8$ | 24° C. | $T_{19}$ | 24° C. |
| $T_9$ | 37.5° C. | $T_{20}$ | 40° C. |

In the Table I, $T_{11}$ may be compared to $T_0$ as being the temperature of the first cooling fluid upon entering the primary side $330_A$ of the liquid-to-liquid heat exchanger 330. Moreover, as shown in the illustrative examples of Table I, introduction of the air-to-liquid heat exchanger 30 may reduce temperature variations of the first cooling fluid in the air-to-liquid heat exchanger 20 and the primary side $330_A$ of the liquid-to-liquid heat exchanger 330, and temperature variations of the second cooling fluid in the secondary side $330_B$ of the liquid-to-liquid heat exchanger 330. Notably, in the cooling arrangement 300, the temperature variation of the first cooling fluid in the air-to-liquid heat exchanger 20 is about $\Delta T=T_1-T_2=17.5K$ while, in the cooling arrangement 400, this temperature variation is about $\Delta T=T_{12}-T_{13}=11K$ in this illustrative example. Similarly, in the cooling arrangement 300, the temperature variation of the first cooling fluid in the primary side $330_A$ of the liquid-to-liquid heat exchanger 330 is about $\Delta T=T_0-T_1=2.5K$ while, in the cooling arrangement 400, this temperature variation is about $\Delta T=T_{11}-T_{12}=2K$ in this illustrative example.

Regarding the second cooling fluid, in the cooling arrangement 300, the temperature variation in the secondary side $330_B$ of the liquid-to-liquid heat exchanger 330 is about $\Delta T=T_5-T_4=14K$ while, in the cooling arrangement 400, this temperature variation is about $\Delta T=T_{16}-T_{15}=13K$ in this illustrative example. Moreover, in the cooling arrangement 300, the air flow is expelled by the fan 142 at a temperature $T_9=39.5°$ C., while, in the cooling arrangement 400, the temperature of the air flow expelled by the fan 142 is $T_{20}=40°$ C. The embodiment illustrated in FIG. 5 increases the temperature of the air expelled from the cooling arrangement 400 by the fan 142, thereby optimizing a cooling potential of the air flow passing through the cooling arrangement 400. The required flow rate of the cooling arrangement 400 is reduced in comparison to the one required by the cooling arrangement 300. This may increase the evaporation efficiency of the evaporating pad 150. This may also lead to reduce operating expenses of the cooling arrangement 400.

In the illustration of Table I, the cooling arrangements 300 are 400 are controlled so that the temperatures $T_0$ and $T_{10}$ of the first cooling fluid from the heat source 110 are identical and so that the temperatures $T_2$ and $T_{13}$ of the first cooling fluid returning to the heat source 110 are identical. The example of Table I is for illustration purposes and does not limit the present technology. For example, an operator of the heat source 110 may desire to use the cooling arrangement 400 to return the first cooling fluid at a lower temperature $T_{13}$ to the heat source 110.

In an embodiment, the closed loop 410 may comprise a bypass arrangement (not shown), that may be similar to the bypass arrangement 70, such that the first cooling fluid may selectively bypass the air-to-liquid heat exchanger 30.

In the embodiment of FIG. 5, the air-to-liquid heat exchangers 20, 30 extend along two respective planes, normal vectors of the two planes being angled one relatively the another. In particular, the air-to-liquid heat exchanger 30 extends vertically and orthogonally with respect to the air flow, and the air-to-liquid heat exchanger 20 extends at an angle with respect to the vertical axis. As depicted in FIG. 6, the air-to-liquid heat exchangers 20, 30 may be disposed adjacently such that the air outlet side of one of the first and second air-to-liquid heat exchangers 20, 30 extends along the air inlet side of another one of the first and second air-to-liquid heat exchangers 20, 30. More specifically, in this embodiment, the air outlet side 28 of the first air-to-liquid heat exchanger 20 extends along the air inlet side 36 of the second air-to-liquid heat exchanger 30. The first and second air-to-liquid heat exchangers 20, 30 are secured to be kept adjacent by, for example and without limitation, affixing (e.g. bolting) the first and second air-to-liquid heat exchangers 20, 30 to a common frame.

Figure 7:
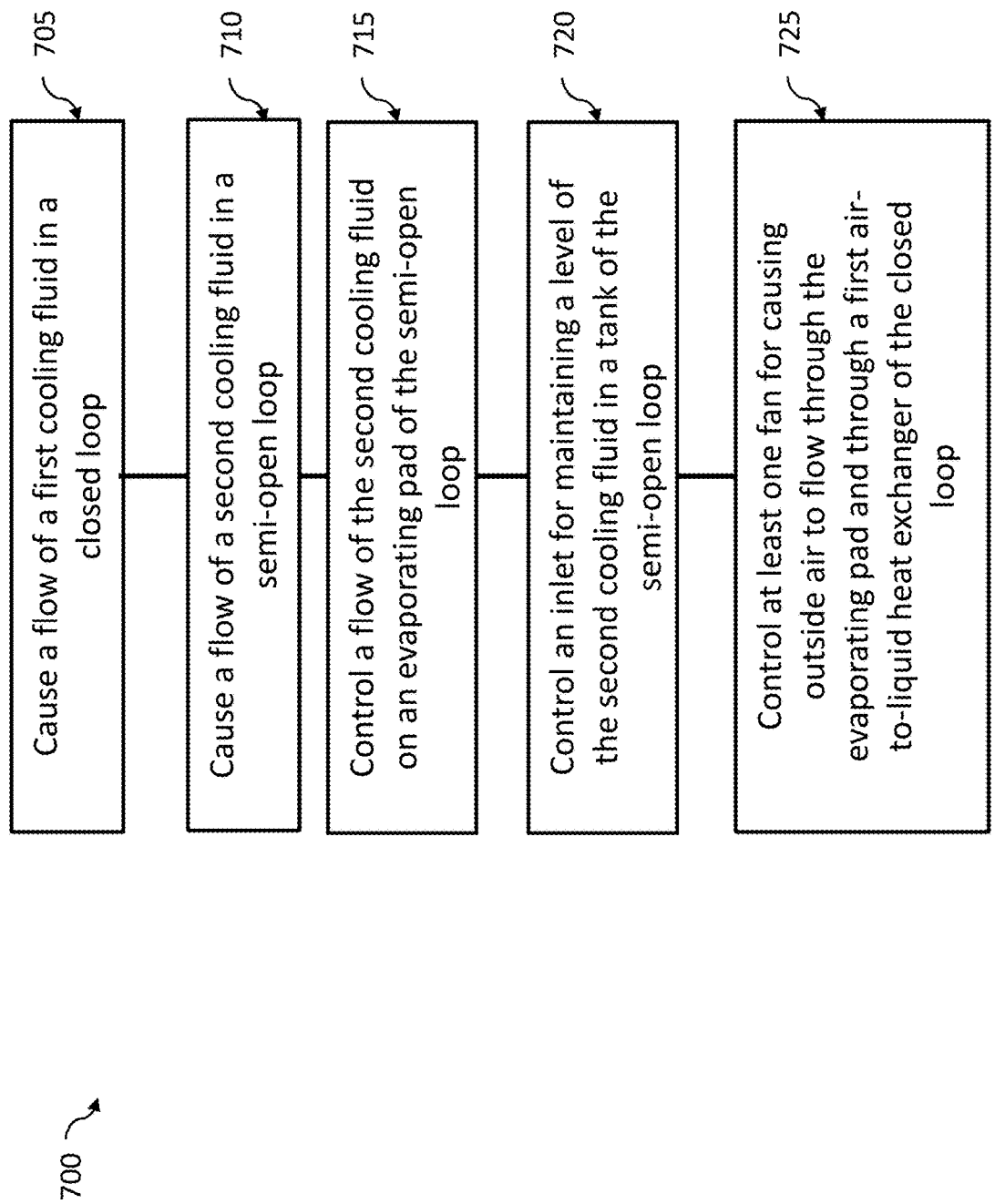
FIG. 7 illustrates a flow diagram showing operations of a method for cooling a heat source in accordance with non-limiting embodiments of the present technology.

FIG. 7 is a sequence diagram showing operations of a method for cooling of a heat source according to some embodiments of the present technology. A sequence 700 comprises a plurality of operations, some of which may be executed in variable order, some of the operations possibly being executed concurrently, some of the operations being optional. The sequence 700 may be implemented, for example and without limitation, in the cooling arrangements 300 and 400.

At operation 705, the first cooling fluid flows in the closed loop 310, the first cooling fluid having been heated by the heat source 110. In this embodiment, the closed loop 310 comprises the primary side $330_A$ of the liquid-to-liquid heat exchanger 330 receiving the first cooling fluid from the heat source 110, the air-to-liquid heat exchanger 20 receiving the first cooling fluid from the primary side $330_A$, and the pump 105 receiving the first cooling fluid from the air-to-liquid heat exchanger 20 and returning the first cooling fluid to the heat source 110.

At operation 710, the second fluid flows in the semi-open loop 320. In this embodiment, the semi-open loop 320 comprises the tank 170 storing the second cooling fluid, the pump 164 drawing the second cooling fluid from the tank 170, the secondary side $330_B$ of the liquid-to-liquid heat exchanger 330 receiving the second cooling fluid from the pump 164, the evaporating pad 150 receiving the second cooling fluid from the secondary side $330_B$ and returning at least a portion of the second cooling fluid to the tank 170, and the inlet 181 fluidly connected to a source of the second cooling fluid for adding the second cooling fluid in the tank 170.

At operation 715, the sensor 161 may sense a temperature of an air flow through the evaporating pad 150. More specifically, the sensor 161 may be disposed such that it may sense the temperature of the air flow entering the evaporating pad 150. The electronic controller 500 may be communicably connected to the sensor 161 to cause the valve 165 and/or the pump 164 to increase a flow of the second cooling fluid on the evaporating pad 150 in response to the temperature of the air flow being above the high air temperature threshold. Additionally, at this operation, the sensor 190 may sense a level of the second cooling fluid in the tank 170. Also at this operation, the sensor 107 may sense a temperature of the first cooling fluid flowing in the closed loop 310 and returning to the heat source 110.

At operation 720, the electronic controller 500 controls the inlet 181 for maintaining a level of the second cooling fluid in the tank 170. The electronic controller 500 may be communicably connected to the sensor 190 to cause the inlet 181 to increase an inflow of the second cooling fluid in the tank 170 in response to the level of the second cooling fluid being below the low level threshold. Additionally or alternatively, in some embodiments, the electronic controller 500 may cause the valve 182 to increase said inflow in response to the level of the second cooling fluid being below than the low level threshold.

At operation 725, the electronic controller 500 controls at least one fan 142 for causing an air flow through the evaporating pad 150 and through the air-to-liquid heat exchanger 20. The electronic controller 500 may be communicably connected to the sensor 107 to cause the respective motor of the fan 142 to increase a rotational speed of the fan 142 about its axis 144 in response to the temperature of the first cooling fluid sensed by the sensor 107 being above the first high fluid temperature threshold. Additionally or alternatively, in some embodiments, the electronic controller 500 may cause the first and/or the second pump 105, 164 to increase their speed in response to the temperature of the first cooling fluid sensed by the sensor 107 being above the first high fluid temperature threshold.

Figure 8:
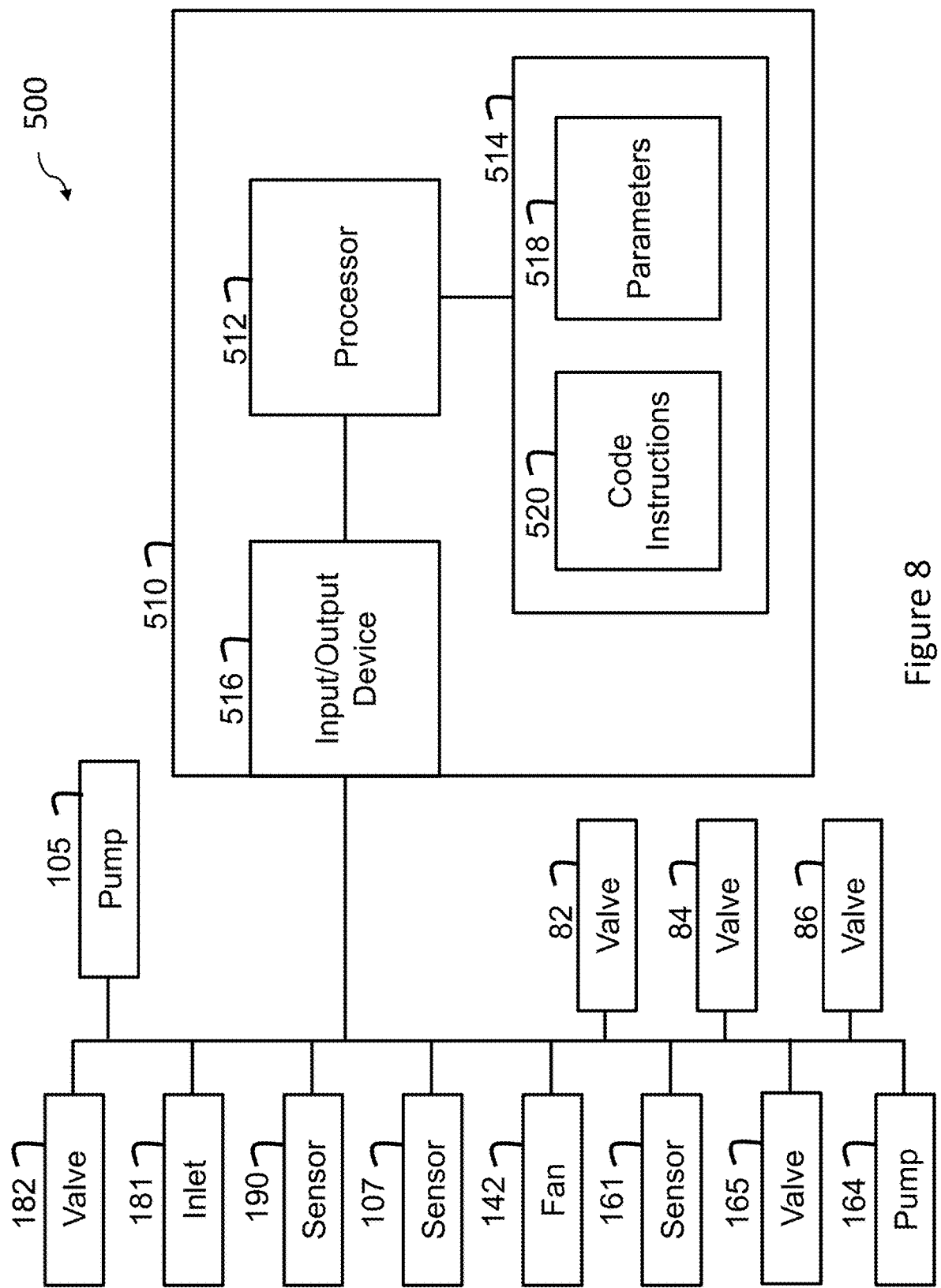
FIG. 8 is a block diagram of a controller in accordance with an embodiment of the present technology.

Each of the operations of the sequence 700 may be configured to be processed by one or more processors, the one or more processors being coupled to a memory device. For example, FIG. 8 is a block diagram of a controller 500 in accordance with an embodiment of the present technology. On FIG. 8, the controller 500 comprises a processor or a plurality of cooperating processors (represented as a processor 512 for simplicity), a memory device or a plurality of memory devices (represented as a memory device 514 for simplicity), one or more input devices and one or more output devices, the input devices and the output devices being possibly combined in one or more input/output devices (represented as a single input/output device 516 for simplicity). The processor 512 is operatively connected to the memory device 514 and to the input/output device 516. The memory device stores a list 518 of parameters, including for example the first and second high fluid temperature thresholds, the high air temperature threshold and the low level threshold. The memory device 514 may comprise a non-transitory computer-readable media for storing instructions 520 that are executable by the processor 512.

The processor 512 is operatively connected, via the input/output interface 516, to those of the sensors 190, 184, 107 and 161, to those of the valves 82, 84, 86, 165 and 182, to those of the pumps 105 and 164, to the inlet 181, and to the at least one fan 142, that may be present in a particular embodiment. The processor 512 executes the instructions 520 stored in the memory device 514 to implement the various above-described functions of the controller 500 that may be present in a particular embodiment.

FIG. 8 as illustrated represents a non-limiting embodiment in which the electronic controller 500 receives measurements from each of the sensors 190, 184, 107 and 161 and controls all the valves 165 and 182, the pumps 105 and 164, the inlet 181 and the at least one fan 142 accordingly. This particular embodiment is not meant to limit the present disclosure and is provided for illustration purposes. As such, only some of the sensors 190, 184, 107 and 161, valves 165 and 182, and pumps 105 and 164 may be included in a particular embodiment.

Table II shows design values for the cooling arrangements 200 and 300. Therefore, the following values are indicative of an effect of the liquid-to-liquid heat exchanger 330 in the cooling arrangement 300. The shown values obtained using the cooling arrangements 200 and 300 are merely examples and does not set forth boundaries and/or limitations of the present technology. Besides, the following design values are obtained with the fan assembly 140 of the cooling arrangements 200 and 300 comprising two fans 142.

TABLE II

|  | Cooling arrangement 200 | Cooling arrangement 300 |
|---|---|---|
| Heat source thermal power (kW) | 150 | 150 |
| Air flow rate of each of the fan 142 (m³/h) | 17600 | 15600 |
| Air pressure drop (Pa) | 200 | 150 |
| Electrical power consumption of each of the fan 142 (W) | 2100 | 1450 |
| Noise emission of each of the fan 142 (dB) | 86.5 | 82.3 |
| Water inlet temperature from the heat source (° C.) | 52 | 52 |
| Water inlet temperature on the evaporating pad 150 (° C.) | 35 | 49 |
| Thermal power dissipated on the air-to-liquid heat exchanger 20 (kW) | 150 | 131.5 |
| Thermal power dissipated on the liquid-to-liquid heat exchanger 330 (kW) | — | 18.5 |
| Total thermal power dissipated by the cooling arrangement (kW) | 150 | 150 |

In those illustrative applications, the heat source 110 generates a total thermal power of 150 kW, which is totally dissipated in the two cooling arrangements 200 and 300. However, despite a rise of the temperature of the second cooling fluid before being distributed on the evaporating pad 150 (35° C. in the cooling arrangement 200 without the liquid-to-liquid heat exchanger 330 versus 49° C. in the cooling arrangement 300 of FIG. 3), the required air flow rate is reduced, and so the rotational speed of each of the fan 142 is decreased. Thus, electrical power consumption of each of the fan 142 is reduced from 2100 W to 1450 W in the cooling arrangement as described in FIG. 3 compared to the cooling arrangement 300. Moreover, this decrease in rotational speed causes a reduction of the noise emission by each of the fan 142 from 86.5 dB to 82.3 dB.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

As such, the cooling arrangement implemented in accordance with some non-limiting embodiments of the present technology can be represented as follows, presented in numbered clauses.

CLAUSES

[Clause 1] A cooling arrangement, comprising:
  a closed loop, comprising:
    a primary side of a liquid-to-liquid heat exchanger, the primary side being adapted for receiving a first cooling fluid heated by a heat source,
    a first air-to-liquid heat exchanger adapted for receiving the first cooling fluid from the primary side of the liquid-to-liquid heat exchanger, and
    a first pump adapted for receiving the first cooling fluid from the air-to-liquid heat exchanger and for returning the first cooling fluid to the heat source;
  a semi-open loop, comprising:
    a tank adapted for storing a second cooling fluid,
    a second pump adapted for drawing the second cooling fluid from the tank,
    a secondary side of the liquid-to-liquid heat exchanger, the secondary side being adapted for receiving the second cooling fluid from the second pump,
    an evaporating pad adapted for receiving the second cooling fluid from the secondary side of the liquid-to-liquid heat exchanger and to return at least a portion of the second cooling fluid to the tank, and
    an inlet fluidly connected to a source of the second cooling fluid, the inlet being controlled for maintaining a level of the second cooling fluid in the tank; and
  at least one fan adapted for causing an air flow through the evaporating pad and through the first air-to-liquid heat exchanger.

[Clause 2] The cooling arrangement of clause 1, wherein the first air-to-liquid heat exchanger, the at least one fan and the evaporating pad are part of a dry cooler.

[Clause 3] The cooling arrangement of clause 1 or 2, wherein the heat source is located in a data center.

[Clause 4] The cooling arrangement of clause 3, wherein the heat source comprises a plurality of heat generating units.

[Clause 5] The cooling arrangement of any one of clauses 1 to 4, wherein the liquid-to-liquid heat exchanger is a plate heat-exchanger.

[Clause 6] The cooling arrangement of any one of clauses 1 to 5, wherein the first air-to-liquid heat exchanger is a finned-tube heat-exchanger.

[Clause 7] The cooling arrangement of any one of clauses 1 to 6, further comprising:
- a first sensor of a temperature of the first cooling fluid at an outlet of the first air-to-liquid heat exchanger; and
- a controller operatively connected to the first sensor, the controller being adapted for increasing a speed of one or more of the first pump, the second pump and the at least one fan in response to the temperature of the first cooling fluid at the outlet of the first air-to-liquid heat exchanger being above a high temperature threshold.

[Clause 8] The cooling arrangement of clause 7, wherein the inlet comprises a first valve adapted for causing an inflow of the second cooling fluid from the source to the tank, the cooling arrangement further comprising a second sensor of a level of the second cooling fluid in the tank, the controller being operatively connected to the second sensor and adapted for controlling the first valve in order to maintain the level of the second cooling fluid in the tank above a low level threshold.

[Clause 9] The cooling arrangement of clause 7 or 8, wherein:
- the semi-open loop further comprises a second valve adapted for regulating a flow of the second cooling fluid to the evaporating pad;
- the cooling arrangement further comprises a third sensor of a temperature of the air flow entering the evaporating pad; and
- the controller is operatively connected to the third sensor and adapted for causing the second valve to increase the flow of the second cooling fluid in response to the temperature of the air flow being above a threshold.

[Clause 10] The cooling arrangement of any one of clauses 1 to 9, wherein the first cooling fluid comprises water.

[Clause 11] The cooling arrangement of any one of clauses 1 to 10, wherein the second cooling fluid comprises water.

[Clause 12] The cooling arrangement of any one of clauses 1 to 11, wherein the closed loop further comprises a second air-to-liquid heat exchanger adapted for receiving the first cooling fluid from the heat source, the second air-to-liquid heat exchanger being positioned in the closed loop upstream of the primary side of the liquid-to-liquid heat exchanger.

[Clause 13] The cooling arrangement of clause 12, wherein the first and second air-to-liquid heat exchangers are positioned so that the air flow passes through one of the first and second air-to-liquid heat exchangers and then through another of the first and second air-to-liquid heat exchangers.

[Clause 14] The cooling arrangement of clause 12 or 13, wherein the first and second air-to-liquid heat exchangers are finned-tube heat-exchangers extending along respective planes.

[Clause 15] The cooling arrangement of any one of clauses 12 to 14, wherein each of the first and second air-to-liquid heat exchangers defining an air inlet side and an air outlet side opposed to the air inlet side, the first and second air-to-liquid heat exchangers being adjacent such that the air outlet side of one of the first and second air-to-liquid heat exchangers extends along the air inlet side of another one of the first and second air-to-liquid heat exchangers.

[Clause 16] A method for cooling of a heat source, the method comprising:
- causing a flow of a first cooling fluid in a closed loop, the closed loop comprising:
  - a primary side of a liquid-to-liquid heat exchanger, the primary side being adapted for receiving the first cooling fluid heated by a heat source,
  - a first air-to-liquid heat exchanger adapted for receiving the first cooling fluid from the primary side of the liquid-to-liquid heat exchanger, and
  - a first pump adapted for receiving the first cooling fluid from the air-to-liquid heat exchanger and for returning the first cooling fluid to the heat source;
- causing a flow of a second cooling fluid in a semi-open loop, the semi-open loop comprising:
  - a tank adapted for storing the second cooling fluid,
  - a second pump adapted for drawing the second cooling fluid from the tank,
  - a secondary side of the liquid-to-liquid heat exchanger, the secondary side being adapted for receiving the second cooling fluid from the second pump,
  - an evaporating pad adapted for receiving the second cooling fluid from the secondary side of the liquid-to-liquid heat exchanger and to return at least a portion of the second cooling fluid to the tank, and
  - an inlet fluidly connected to a source of the second cooling fluid,
- controlling the inlet for maintaining a level of the second cooling fluid in the tank; and
- controlling at least one fan for causing an air flow through the evaporating pad and through the first air-to-liquid heat exchanger.

[Clause 17] The method of clause 16, further comprising:
sensing a temperature of the first cooling fluid returning to the heat source; and
increasing a speed of one or more of the first pump, the second pump and the at least one fan in response to the temperature being higher than a threshold.

[Clause 18] The method of clause 16 or 17, further comprising:
sensing a level of the second cooling fluid in the tank; and
causing a first valve to increase an inflow of the second cooling fluid from the source to the tank in response to the level of the second cooling fluid in the tank being below a low level threshold.

[Clause 19] The method of any one of clauses 16 to 18, further comprising:
sensing a temperature of the air flow entering the evaporating pad; and
causing one or more of a second valve and the second pump to increase a flow of the second cooling fluid to the evaporating pad in response to the temperature of the air flow being above a threshold.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement, comprising:
a closed loop, comprising:
a primary side of a liquid-to-liquid heat exchanger, the primary side being adapted for receiving a first cooling fluid heated by a heat source,
a first air-to-liquid heat exchanger adapted for receiving the first cooling fluid from the primary side of the liquid-to-liquid heat exchanger, and
a first pump adapted for receiving the first cooling fluid from the first air-to-liquid heat exchanger and for returning the first cooling fluid to the heat source;

a semi-open loop, comprising:
    a tank adapted for storing a second cooling fluid,
    a second pump adapted for drawing the second cooling fluid from the tank,
    a secondary side of the liquid-to-liquid heat exchanger, the secondary side being adapted for receiving the second cooling fluid from the second pump,
    an evaporating pad adapted for receiving the second cooling fluid from the secondary side of the liquid-to-liquid heat exchanger and for returning at least a portion of the second cooling fluid to the tank, and
    an inlet fluidly connected to a source of the second cooling fluid, the inlet being controlled for maintaining a level of the second cooling fluid in the tank; and
    at least one fan adapted for causing an air flow through the evaporating pad and through the first air-to-liquid heat exchanger.

2. The cooling arrangement of claim 1, wherein the first air-to-liquid heat exchanger, the at least one fan and the evaporating pad are part of a dry cooler.

3. The cooling arrangement of claim 1, wherein the heat source is located in a data center.

4. The cooling arrangement of claim 3, wherein the heat source comprises a plurality of heat generating units.

5. The cooling arrangement of claim 1, wherein the liquid-to-liquid heat exchanger is a plate heat-exchanger.

6. The cooling arrangement of claim 1, further comprising:
    a first sensor of a temperature of the first cooling fluid at an outlet of the first air-to-liquid heat exchanger; and
    a controller operatively connected to the first sensor, the controller being adapted for increasing a speed of one or more of the first pump, the second pump and the at least one fan in response to the temperature of the first cooling fluid at the outlet of the first air-to-liquid heat exchanger being above a high temperature threshold.

7. The cooling arrangement of claim 6, wherein the inlet comprises a first valve adapted for causing an inflow of the second cooling fluid from the source to the tank, the cooling arrangement further comprising a second sensor of a level of the second cooling fluid in the tank, the controller being operatively connected to the second sensor and adapted for controlling the first valve in order to maintain the level of the second cooling fluid in the tank above a low level threshold.

8. The cooling arrangement of claim 6, wherein:
    the semi-open loop further comprises a second valve adapted for regulating a flow of the second cooling fluid to the evaporating pad;
    the cooling arrangement further comprises a third sensor of a temperature of the air flow entering the evaporating pad; and
    the controller is operatively connected to the third sensor and adapted for causing the second valve to increase the flow of the second cooling fluid in response to the temperature of the air flow being above a threshold.

9. The cooling arrangement of claim 1, wherein the closed loop further comprises a second air-to-liquid heat exchanger adapted for receiving the first cooling fluid from the heat source, the second air-to-liquid heat exchanger being positioned in the closed loop upstream of the primary side of the liquid-to-liquid heat exchanger.

10. The cooling arrangement of claim 9, wherein the first and second air-to-liquid heat exchangers are positioned so that the air flow passes through one of the first and second air-to-liquid heat exchangers and then through another of the first and second air-to-liquid heat exchangers.

11. The cooling arrangement of claim 9, wherein each of the first and second air-to-liquid heat exchangers define an air inlet side and an air outlet side opposed to the air inlet side, the first and second air-to-liquid heat exchangers being adjacent such that the air outlet side of one of the first and second air-to-liquid heat exchangers extends along the air inlet side of another one of the first and second air-to-liquid heat exchangers.

12. A method for cooling of a heat source, the method comprising:
    causing a flow of a first cooling fluid in a closed loop, the closed loop comprising:
        a primary side of a liquid-to-liquid heat exchanger, the primary side being adapted for receiving the first cooling fluid heated by a heat source,
        a first air-to-liquid heat exchanger adapted for receiving the first cooling fluid from the primary side of the liquid-to-liquid heat exchanger, and
        a first pump adapted for receiving the first cooling fluid from the first air-to-liquid heat exchanger and for returning the first cooling fluid to the heat source;
    causing a flow of a second cooling fluid in a semi-open loop, the semi-open loop comprising:
        a tank adapted for storing the second cooling fluid,
        a second pump adapted for drawing the second cooling fluid from the tank,
        a secondary side of the liquid-to-liquid heat exchanger, the secondary side being adapted for receiving the second cooling fluid from the second pump,
        an evaporating pad adapted for receiving the second cooling fluid from the secondary side of the liquid-to-liquid heat exchanger and for returning at least a portion of the second cooling fluid to the tank, and
        an inlet fluidly connected to a source of the second cooling fluid,
    controlling the inlet for maintaining a level of the second cooling fluid in the tank; and
    controlling at least one fan for causing an air flow through the evaporating pad and through the first air-to-liquid heat exchanger.

13. The method of claim 12, further comprising:
    sensing a temperature of the first cooling fluid returning to the heat source; and
    increasing a speed of one or more of the first pump, the second pump and the at least one fan in response to the temperature being higher than a threshold.

14. The method of claim 12, further comprising:
    sensing a level of the second cooling fluid in the tank; and
    causing a first valve to increase an inflow of the second cooling fluid from the source to the tank in response to the level of the second cooling fluid in the tank being below a low level threshold.

15. The method of claim 12, further comprising:
    sensing a temperature of the air flow entering the evaporating pad; and
    causing one or more of a second valve and the second pump to increase a flow of the second cooling fluid to the evaporating pad in response to the temperature of the air flow being above a threshold.

* * * * *